(12) United States Patent
Ito

(10) Patent No.: US 8,174,043 B2
(45) Date of Patent: May 8, 2012

(54) LIGHT EMITTING APPARATUS

(75) Inventor: Yuhki Ito, Aichi-ken (JP)

(73) Assignee: Toyoda Gosei Co., Ltd., Nishikasugai-gun, Aichi-ken (JP)

( * ) Notice: Subject to any disclaimer, the term of this patent is extended or adjusted under 35 U.S.C. 154(b) by 188 days.

(21) Appl. No.: 12/461,723

(22) Filed: Aug. 21, 2009

(65) Prior Publication Data

US 2009/0309121 A1 Dec. 17, 2009

(30) Foreign Application Priority Data

Sep. 4, 2007 (JP) ................. P2007-228419
Sep. 3, 2008 (JP) ................. P2008-225839

(51) Int. Cl.
*H01L 33/00* (2010.01)
(52) U.S. Cl. ............ 257/99; 257/81; 257/98; 257/100; 257/103; 438/26; 438/28; 438/119; 438/125
(58) Field of Classification Search .............. None
See application file for complete search history.

(56) References Cited

U.S. PATENT DOCUMENTS

2006/0159937 A1 7/2006 Miyoshi et al.
2008/0001140 A1* 1/2008 Haitko et al. ................. 257/40

FOREIGN PATENT DOCUMENTS

| JP | 8-122284 | 5/1996 |
|----|----------|--------|
| JP | 2002-350377 | 12/2002 |
| JP | 2004-221308 | 8/2004 |
| JP | 2006-202952 | 8/2006 |
| JP | 2006-335857 | 12/2006 |

* cited by examiner

*Primary Examiner* — Fernando L Toledo
*Assistant Examiner* — Kyoung Lee
(74) *Attorney, Agent, or Firm* — McGinn IP Law Group, PLLC

(57) ABSTRACT

In a light-emitting apparatus using a silicone resin as a sealant of its light-emitting element, it is intended to prevent discoloration of its lead frame. A light-emitting element fixed to a lead frame is sealed with a sealed portion formed by a silicone resin. An average spin-spin relaxation time of the silicone resin is equal to or smaller than 100 microseconds at 25° C. at a resonance frequency of 25 MHz.

20 Claims, 2 Drawing Sheets

LIGHT EMITTING APPARATUS

CROSS-REFERENCE TO RELATED APPLICATIONS

This application claims priority from Japanese Patent Application JP-2008-225839 filed on Sep. 3, 2008 and the entire subject matter of which is incorporated herein by reference.

TECHNICAL FIELD

The present invention relates to a light-emitting apparatus including a light-emitting element sealed with a silicone resin. According to the light-emitting apparatus of the invention, discoloration of a lead frame on which the light-emitting element is mounted can be prevented.

BRIEF DESCRIPTION OF RELATED ART

Hitherto, a light-emitting apparatus including a light-emitting element sealed with a transparent resin is known. As the type of the transparent resin, an epoxy resin has been used in consideration of heat resistance, chemical resistance, electric insulation performance, and light transparency. However, with the increase in light intensity of the light-emitting element, a problem that the epoxy resin is yellowed due to the heat and light from the light emitting element. As a result, transparency of the epoxy resin is lowered and light intensity is decreased. Therefore, a silicone resin is developed as a sealant for the light emitting element because a silicone resin has more excellent character in heat resistance and in light resistance than the epoxy resin. (refer to JP-A-2006-202952 and JP-A-2004-221308)

On the other hand, recently, with the advancement in the solid-state NMR, a pulse NMR method has attracted attention as a method for evaluating characteristics of plastic materials and the like. For example, using the NMR method, it is possible to measure a spin-spin relaxation time (transverse relaxation time) of $^1H$ nuclei to evaluate the performance of polymers (refer to JP-A-2002-350377, JP-A-2006-335857). Moreover, a method measuring the relaxation time for evaluating the crosslinking degree and the like of a rubber is also developed. (refer to JP-A-H08-122284)

However, the inventors found a problem when a silicon resin is used as a sealant. The problem is that a lead frame formed from a silver-plated copper base material and formed from copper or aluminum is corroded and discolored to reduce reflectivity and lower light intensity. An object of the invention is to provide a light-emitting apparatus using a silicone resin as a sealant for a light-emitting element, which is capable of preventing the discoloration of the lead frame and hardly decreases light intensity.

SUMMARY

The inventors found that the lead frame is corroded and discolored when a silicon resin is used as a sealant under the condition that at least a surface of the lead frame facing light emitting element is formed from Ag, Cu, or Al as a major component. Also, the inventor found that the degree of discoloration distinctly depends on the type of the silicon resin. Furthermore, the inventors found a strong correlation between the degree of discoloration and the spin-spin relaxation time of the silicon resin measured by the pulse NMR method. Thus, the invention is achieved.

The light-emitting apparatus of the first aspect of the invention includes a light emitting element, a lead frame on which the light emitting element is fixed, at least a surface of the lead frame facing the light emitting element is formed from Ag, Cu, or Al as a major component, and a silicon sealing portion sealing the light emitting element by a silicon resin. The silicon resin has an average spin-spin relaxation time of $^1H$ nuclei equal to or less than 100 µs at 25 degree Celsius and 25 MHz resonant frequency, and the average spin-spin relaxation time is measured by pulse NMR method.

According to the test results of the inventors, the use of a silicone resin whose average spin-spin relaxation time of $^1H$ nuclei measured by the pulse NMR method is equal to or less than 100 microseconds, further preferably 50 microseconds or less at 25° C. at a resonance frequency of 25 MHz can prevent discoloration of Ag, Cu, or Al of the surface of the lead frame over a long period of time.

The inventor also found that, when the lead frame is silver-plated, the silver plating particularly tends to be discolored by the action of a sulfur-based compound or a chlorine-based compound. Also, the discoloration of the silver plating is effectively prevented by the use of the silicone resin whose average spin-spin relaxation time of $^1H$ nuclei measured by the pulse NMR method is equal to or less than 100 microseconds at 25° C. at a resonance frequency of 25 MHz. Accordingly, the light-emitting apparatus of the second aspect of the invention has at least a surface of the lead frame facing the light emitting element which is silver-plated.

Furthermore, the light-emitting apparatus of the third aspect of the invention has a thermoset silicon resin including a phenyl group and a norbornene backborn. According to the test results of the inventors, among the silicone resins, the thermosetting silicone resin including a phenyl group and a norbornene backborn shows a short spin-spin relaxation time and can effectively prevent the discoloration of the lead frame having a surface formed from Ag, Cu, or Al as a major component.

DETAIL DESCRIPTION OF EXEMPLARY EMBODIMENTS OF THE PRESENT INVENTION

Figure 1:
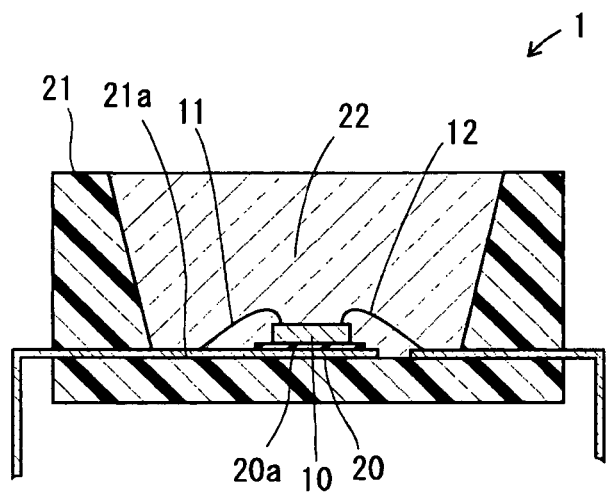
FIG. 1 is a schematic cross-sectional view of a top-view type light-emitting apparatus.

In the light-emitting apparatus of the invention, a light-emitting element is fixed to a lead frame. Also, at least a surface of the lead frame facing the light emitting element is formed from Ag, Cu, or Al as a major component. As examples of such lead frame, lead frames formed from copper, copper alloys such as brass or stainless steel as a base material which is silver plated can be cited. Also, A lead frame having a base plating like Cu plating under the silver plating. Additionally, as a lead frame without plating, lead frames formed from copper or copper alloy, or lead frames formed from Al or Al alloy can be cited. The surface of these lead frames tend to be discolored by the action of a sulfur based compound or a chlorine-based compound but, in the light-emitting apparatus of the invention, the discoloration of the lead frames can be effectively prevented over a long period of time.

Moreover, in the light-emitting apparatus of this embodiment, as the silicone resin for sealing the light-emitting element, a silicone resin whose average spin-spin relaxation time of $^1$H nuclei measured by the pulse NMR method is equal to or less 100 microseconds or less at 25° C. at a resonance than frequency of 25 MHz is used.

Herein, the pulse NMR method targeting $^1$H nuclei is a method measuring a $^1$H nuclei magnetic relaxation time of solid or liquid. In this method, a sample is placed on a strong magnetic field and subjected to an electromagnetic wave pulse, and a response signal against the electromagnetic wave pulse is detected by a coil. As the magnetic relaxation phenomena of $^1$H nucleus, there are two kinds of relaxation phenomena. The first relaxation phenomenon is a relaxation process includes energy transfer. In the first process, absorbed electromagnet energy is radiated and energy distribution returns to original energy distribution. The second relaxation phenomenon is a relaxation process from a state where nuclear spin precession is coherent to a state where the precession is random. The second relaxation phenomenon does not include energy transfer.

The first relaxation phenomenon is called as a spin-lattice relaxation (vertical relaxation). The essence of the spin-lattice relaxation is process of energy radiation which is absorbed. The second relaxation phenomenon is called as a spin-spin relaxation (transverse relaxation). The spin-spin relaxation is a relaxation process changing from a coherent state to a random state in the meaning of thermodynamics. These two types of relaxation phenomena can be individually measured according to the direction of the detection coil. Namely, the spin-lattice relaxation (vertical relaxation) is detected when the detecting coil is directed in the same direction as the external magnetic field (i.e., vertical direction). The spin-spin relaxation (transverse relaxation) is detected when the detecting coil is directed in a direction vertical to the external magnetic field (i.e., transverse direction).

In the invention, silicone resins are evaluated and selected by the spin-spin relaxation. Therefore, a sample tube containing a silicone resin is irradiated with an electromagnetic pulse while the tube is rotated with slanting it at a predetermined angel (magic angle) and a free induction decay (FID) signal is detected by the detecting coil directed in a direction vertical to the external magnetic field (i.e., transverse direction).

Incidentally, because a fine structure of an actual silicone resin does not have an equivalent and completely homogeneous structure in the crystalline phase, the non-crystalline phase, and the boundary of these phases, the obtained free induction decay (FID) signals include different spin-spin relaxation information corresponding to each phase. However, the relaxation time corresponding to each of the individual phases is separated into a Gaussian function component and an exponential function component and can be determined for each phase. In the invention, such a silicone resin is selected that the average spin-spin relaxation time of $^1$H nuclei measured by the pulse NMR method is equal to or less than 100 microseconds, further preferably 50 microseconds or less at 25° C. at a resonance frequency of 25 MHz. By selecting such a silicone resin, the corrosion of a lead frame formed from a copper base material is silver-plated and a lead frame formed from copper or aluminum is prevented. As a result, the reduction of reflectivity can be prevented and accordingly, the decrease in light intensity of the light-emitting apparatus can be prevented.

The reason why the discoloration of the lead frame is prevented in the light-emitting apparatus including the silicone resin selected by such standard is used as a sealant is not clear but the following may be considered. Namely, the silicone resin to be used as a sealant generally has large gas permeability. Therefore, halogen-based gases such as hydrochloric acid gas and sulfur-based gases such as sulfur dioxide gas contained in the open air reach the lead frame surface through the silicone resin to corrode and discolor the silver plating of the lead frame surface. However, the spin-spin relaxation time (transverse relaxation time) of the silicone resin varies depending on the crosslinking degree of the silicone resin (e.g., JP-A-8-122284). The silicone resin having a larger crosslinking degree shows a shorter spin-spin relaxation time (transverse relaxation time) and the gas permeability reduces. Therefore, the permeation of the sulfur-based gases and chlorine-based gases becomes difficult and, as a result, the discoloration of the lead frame is prevented.

The light-emitting apparatus of the invention can be applied irrespective of the shape of LED, for example, a top-view type, a side-view type, a shell type, or a COB type. Moreover, the effect of the invention is particularly remarkable in light-emitting elements emitting a light having a short wavelength. Concretely, the light-emitting element such as blue color-emitting LED, purple color-emitting LED, and monochromic LED or white LED containing a fluorescent substance, which uses purple color-emitting LED can be cited. A silicone sealant is adopted owing to durability against such a light-emitting element. As the light-emitting element emitting a light having a short wavelength, a Group III nitride-based compound semiconductor light-emitting element is preferable. Herein, the Group III nitride-based compound semiconductor is represented by the general formula $Al_xGa_yIn_{1-x-y}N$ ($0 \leq X \leq 1$, $0 \leq Y \leq 1$, $0 \leq X+1 \leq 1$), wherein at least a part of the Group III element may be replaced by boron (B), thallium (Tl), or the like and at least a part of nitrogen (N) may be also replaced by phosphorus (P), arsenic (As), antimony (Sb), bismuth (Bi), or the like.

Moreover, the Group III nitride-based compound semiconductor may be one containing any dopant. As n-type impurities, silicon (Si), germanium (Ge), selenium (Se), tellurium (Te), carbon (C), and the like can be used. As p-type impurities, magnesium (Mg), zinc (Zn), beryllium (Be), calcium (Ca), strontium (Sr), barium (Ba), and the like can be used. In this connection, after the p-type impurity is doped, the III nitride-based compound semiconductor can be exposed to electron beam irradiation, plasma irradiation, or heating by an oven but the treatment is not essential.

The Group III nitride-based compound semiconductor layer is formed by an MOCVD (organic metal vapor phase growth) method. It is not necessary to form all the semiconductor layers constituting the element by the MOCVD method and it is possible to use a molecular beam crystal epitaxy method (MBE method), a halide-based vapor phase epitaxy method (HVPE method), a spattering method, an ion plating method, and/or the like in combination.

As the configuration of the light-emitting element, a homostructure having an MIS junction, a PIN junction, or a pn junction, a hetero-structure, or a double hetero-structure can be adopted. It is also possible to adopt a quantum well structure (single quantum well structure or multiple quantum well structure) as a light-emitting layer. As such a Group III nitride-based compound semiconductor light-emitting element, a face-up type whose main light-receiving light-emitting direction (electrode face) is directed to a light-axis direction of the light apparatus and a flip-chip type whose main light-receiving light-emitting direction is directed to a reverse direction of the light axis and a reflected light can be adopted.

The following describes embodiments of the invention in detail while Examples thereof are compared with Comparative Examples.

<Measurement of Spin-Spin Relaxation Time of Various Silicone Resins>

The spin-spin relaxation times of various silicone resins were measured under the following conditions.

| | |
|---|---|
| Measuring apparatus: | JOEL MU 25 Model |
| Resonance frequency: | 25 MHz |
| Measuring temperature: | 25° C. |
| Observing nucleus species: | $^1$H |
| Magnet: | permanent magnet 0.58 T |
| Detecting method: | QD method (Quadrature Detection) |
| Pulse series: | solid-echo method |
| RF pulse width: | 2 microseconds |
| Pulse intervals: | 8 microseconds |
| Pulse repeating time: | 1 sec |

<Durability Test of LED>

Using a silicone resin whose spin-spin relaxation time was measured as mentioned above as a sealant, a top-view type blue light-emitting apparatus 1 using a face-up light emitting element was prepared as shown in FIG. 1 and was subjected to a durability test. The light-emitting element 10 is fixed onto a lead frame 20 by a silicone paste 20a. A silver plating is applied over the whole surface of the lead frame. An n electrode and a p electrode of the light-emitting element 10, which are not shown in the figure, are wire-bonded to the lead frame 20 with Au wires 11 and 12, respectively. The lead frame 20 is fixed to the bottom surface of a concave portion 21a provided in a resin case 21 and is embedded in the resin case 21 so that the both ends are exposed. Furthermore, the concave, portion 21a is sealed with a silicone-sealed portion 22 formed from the silicone resin, thereby the light-emitting element 10 is sealed.

The above light-emitting apparatus 1 is produced as follows.

A silver-plated lead frame 20 is prepared, a resin case 21 was formed through molding, and the lead frame 20 is fixed to the bottom of the concave portion 21a. The light-emitting element 10 is fixed onto the silver-plated lead frame 20 by a silicone paste 20a. The n electrode and p electrode of the light-emitting element 10, which are not shown in the figure, are wire-bonded to the lead frame 20 with Au wires 11 and 12, respectively. Then, the concave portion 21a was filled with each of the various silicone resins whose spin-spin relaxation times were measured by the method described above and each resin was cured under heating. Thus, the light-emitting apparatus 1 is obtained.

Especially, the silicone resin 20a of the light-emitting apparatus 1 was evaluated by pulse NMR method. The pulse NMR method measures the average spin-spin relaxation time of $^1$H nuclei in the silicone resin 20a. The silicone resin 20a was evaluated whether the average spin-spin relaxation time of $^1$H nuclear equal to or smaller than 100 μs at 25° C. at the resonance frequency 25 MHz. The silicone resin 20a which satisfy the condition was used for the light-emitting apparatus 1. The measurement and evaluation are performed after thermoset of the silicone resin 20a.

A durability test for a period of continuous 1000 hours was performed on the light-emitting apparatuses prepared using various silicone resins as sealants as mentioned above under electric current flow to emit light (5 mA). Also, a durability test for a period of continuous 1000 hours was similarly performed without electric current flow. In order to accelerate deterioration, the test is performed in the air heated at 85° C. For evaluation, the apparatuses were evaluated with a light intensity remaining ratio (LIRR) defined as ratio of Light intensity of light-emitting apparatus after test to Light intensity of light-emitting apparatus before test.

<Evaluation>

The types of the silicone resins measured are shown in Table 1. Moreover, the spin-spin relaxation times measured and the results of the durability test are shown in Table 2. In this connection, the unit of all the relaxation times in Table 2 is microsecond. Moreover, $T_2(1)$, $T_2(2)$, and $T_2(3)$ in the column of relaxation time are the relaxation times determined for respective phases. Furthermore, the amounts of the components AM(1), AM(2), and AM(3) represent ratios of respective phases which show relaxation times $T_2(1)$, $T_2(2)$, and $T_2(3)$.

TABLE 1

| | | | Main chain | | | Crosslinking site | | | | Refractive |
| | | | Methyl | | | | | | | |
| | Provider | | Dimethyl siloxane | phenyl siloxane | Diphenyl siloxane | SiH | SiCH=CH$_2$ | Si-norbornene | Silicate | index after curing |
|---|---|---|---|---|---|---|---|---|---|---|
| Example 1 | Shin-Etsu Chemical SCR-1004A/B | | | | | | | | | 1.50 |
| Example 2 | Shin-Etsu Chemical | A liquid | — | — | 67 | 10 | 13 | — | 9 | 1.53 |
| | | B liquid | 18 | — | 63 | — | 18 | — | 1 | |
| Example 3 | Shin-Etsu Chemical | A liquid | 55 | — | — | — | — | 27 | 18 | 1.53 |
| | | B liquid | 15 | — | 44 | 27 | — | 9 | — | |
| Example 4 | | A liquid | — | 97 | — | — | 3 | — | — | — |
| | | B liquid | — | — | 36 | 12 | 14 | — | 38 | |
| Comparative Example 1 | GE | A liquid | 99 | — | — | — | 1 | — | — | 1.41 |
| | Toshiba Silicone | B liquid | 96 | — | — | 3 | 1 | — | — | |
| Comparative Example 2 | Shin-Etsu Chemical | A liquid | 70 | — | — | — | 2 | — | 28 | 1.41 |
| | | B liquid | 79 | 4 | — | 12 | 3 | — | 2 | |

TABLE 1-continued

| | | | Main chain | | | Crosslinking site | | | Refractive |
| | | | | Methyl | | | | | |
| | Provider | | Dimethyl siloxane | phenyl siloxane | Diphenyl siloxane | SiH | SiCH=CH$_2$ | Si-norbornene | Silicate | index after curing |
|---|---|---|---|---|---|---|---|---|---|---|
| Comparative Example 3 | Toray Dow Corning EG6301 | A liquid | 89 | — | — | — | 6 | — | 6 | 1.40 |
| | | B liquid | 86 | — | — | 12 | 1 | — | 2 | |

Curing conditions:
Example 1 100° C./1.5 hr → 150° C./2.0 hr
Example 2 150° C./1.0 hr
Example 3 100° C./1.5 hr → 150° C./5.0 hr
Example 4 150° C./1.0 hr
Comparative Example 1 80° C./1.5 hr → 150° C./0.5 hr
Comparative Example 2 60° C./1.0 hr → 100° C./1.0 hr → 150° C./4.0 hr
Comparative Example 3 80° C./1.0 hr → 150° C./1.0 hr

TABLE 2

| | Spin-spin relaxation time | | | Amount of component | | | T$_2$ average | LIRR 85° C./5 mA 1000 hr | LIRR 85° C. storage 1000 hr |
|---|---|---|---|---|---|---|---|---|---|
| Sample | T$_2$(1) | T$_2$(2) | T$_2$(3) | AM(1) | AM(2) | AM(3) | | | |
| Example 1 | 27 | 15 | — | 0.19 | 0.81 | — | 17 | 0.89 | 0.94 |
| Example 2 | 29 | 13 | — | 0.86 | 0.14 | — | 27 | 0.81 | 0.94 |
| Example 3 | 35 | 15 | — | 0.23 | 0.77 | — | 20 | 0.96 | |
| Example 4 | 175 | 86 | 33 | 0.23 | 0.20 | 0.57 | 76 | 0.96 | |
| Comparative Example 1 | 1500 | 98 | | 0.94 | 0.06 | | 1417 | 0.66 | 0.86 |
| Comparative Example 2 | 960 | 126 | 55 | 0.62 | 0.12 | 0.26 | 628 | 0.83 | |
| Comparative Example 3 | 1760 | 117 | 44 | 0.62 | 0.17 | 0.21 | 1112 | 0.74 | 0.88 |

From Table 2, it is found that each of the silicone resins used in the light-emitting apparatuses of Examples 1 to 4 shows a spin-spin relaxation time T$_2$(1) of 27 to 35 microseconds and the spin-spin relaxation time T$_2$(1) is extremely short as compared with that of each of the silicone resins used in the light-emitting apparatuses of Comparative Examples 1 to 3 is 960 to 1760 microseconds. Moreover, in the results of the durability test, the light-emitting apparatuses of Examples 1 to 4 showed a small change in light intensity and a stable light intensity for a long period of time. To the contrary, in the light-emitting apparatuses of Comparative Examples 1 to 3, the light intensity rapidly decreases. This is because silver plating of the lead frame is hardly discolored in the light-emitting apparatuses of Examples 1 to 3. It is obvious from the fact that discoloration is hardly shown in the lead frames of the light-emitting apparatuses of Examples 1 to 4 while discoloration is shown when the surfaces of the lead flames of the light-emitting apparatuses of Comparative Examples 1 to 3 were observed on a stereoscopic microscope.

Moreover, as shown in Table 1, a large ratio of a diphenyl-siloxane structure was observed from the raw material of the silicone resin used in the light-emitting apparatus of Example 2 and large ratios of a phenylsiloxane structure and a Si-norbornene structure are observed from the raw material of the silicone resin used in the light-emitting apparatus of Example 3. Furthermore, as shown in Table 2, it is found that the silicone resins containing these components show shortened relaxation times and can prevent the discoloration of the lead frames. Among these components, the Si-norbornene structure contains a carbon-carbon double bond and the Si-norbornene structure crosslinks between Si—H (refer to the following reaction scheme). Therefore, it is presumed that diffusion of the sulfur-based gases and the chlorine-based gases is retarded through the crosslinking.

[Chem 1]

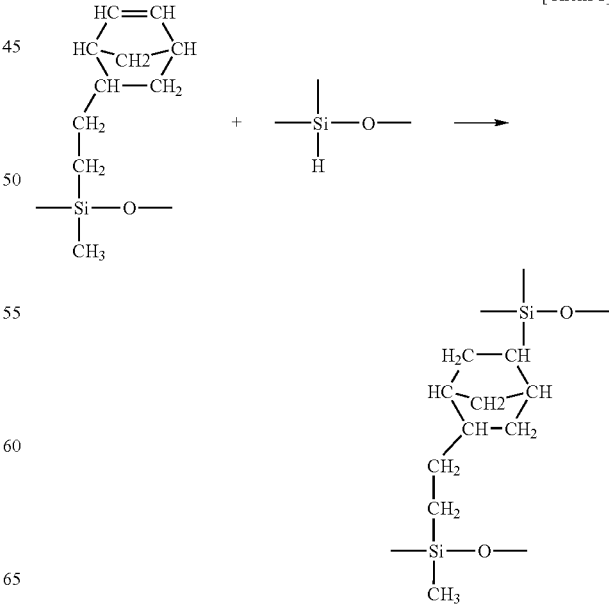

<Durability Test of Various Light-Emitting Apparatuses>

Using top-view type blue LED and white LED using a face-up light emitting element, a durability test was performed. As the silicone resin as a sealant, silicone resins used in the above Example 3, Comparative Example 1, Comparative Example 2, and Comparative Example 3 were employed. The spin-spin relaxation times $T_2$ (average) of respective silicone resins are 20 microseconds for Example 3, 1417 microseconds for Comparative Example 1, 628 microseconds for Comparative Example 2, and 1112 microseconds for Comparative Example 3.

The durability test conditions were as follows: in the air at 85° C. with electric current flow of 5 mA or in the air at 85° C. without electric current flow. The test time was 1000 hours. The apparatuses were evaluated with a light intensity remaining ratio defined by the value of (Light intensity of light-emitting apparatus after test)/(Light intensity of light-emitting apparatus before test).

Figure 2:
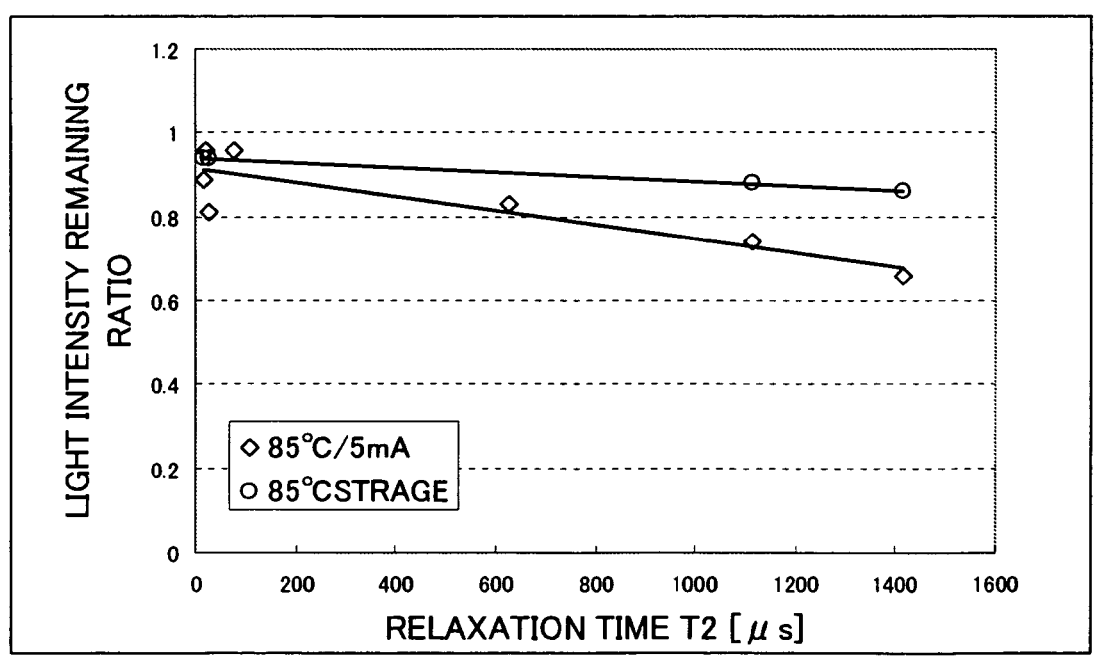
FIG. 2 is a graph showing a relationship between a relaxation time and a light-intensity remaining ratio in durability test of various light-emitting apparatuses.

As a result, as shown in FIG. 2, in the case of LED using the silicone resin of Example 3 showing a short relaxation time, i.e., a spin-spin relaxation time $T_2$ (average) of 20 microseconds, the light intensity remaining ratio was high under either environment. Furthermore, the longer the value of the spin-spin relaxation time $T_2$ (average) is, the lower the light intensity remaining ratio is. Thus, it was appreciated that the value of the spin-spin relaxation time $T_2$ (average) of the silicone resin used as the sealant highly correlates with the light intensity remaining ratio. Moreover, when the discoloration of the lead frame after the test was observed on a stereoscopic microscope, it was appreciated that a silicone resin showing a longer value of the spin-spin relaxation time $T_2$ (average) results in a larger degree of discoloration. Also, from the results of FIG. 2, it is found that an excellent light intensity remaining ratio is shown when the spin-spin relaxation time $T_2$ (average) is equal to or less than 100 microseconds.

Moreover, when a refractive index after curing was measured, as shown in Table 2, the silicone resins of Examples 1 to 3 has a refractive index of 1.5 or more, while the refractive index was as low as 1.41 in Comparative Examples 1 and 2 and 1.40 in Comparative Example 3. Thus, the shorter the value of the spin-spin relaxation time $T_2$ (average) is, the larger the refractive index tends to be.

Figure 3:
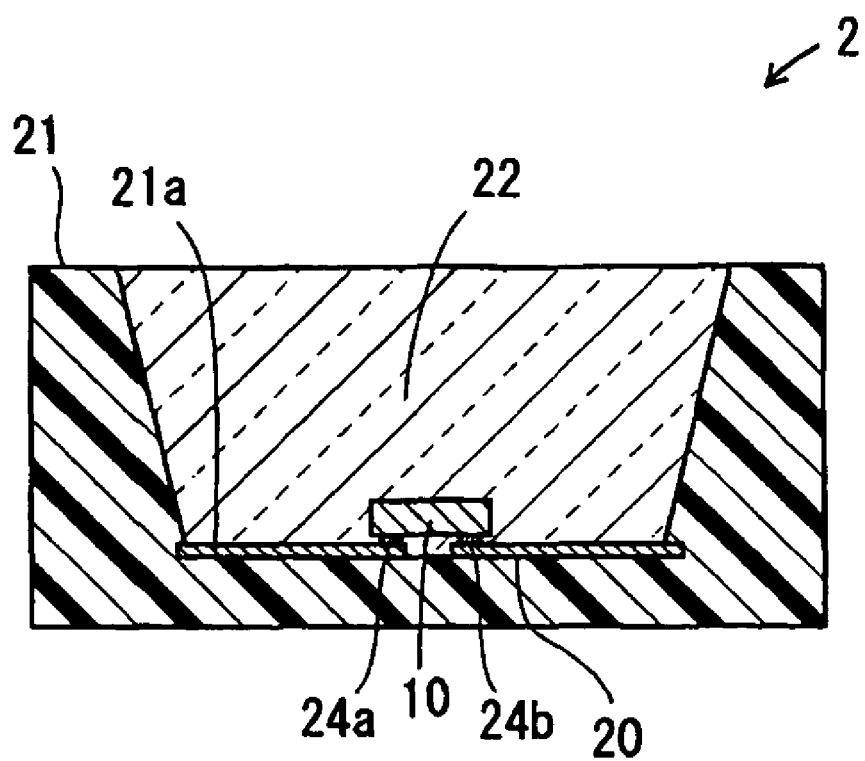
FIG. 3 is a schematic cross-sectional view of a light-emitting apparatus fitted with a flip-chip type light-emitting element.

The light-emitting apparatus of the invention is also applicable to LED using a flip-chip type light-emitting element. The structure is shown in FIG. 3. In the LED, the flip-chip type light-emitting element 110 is fixed with Au bumps 24a and 24b. The other constitutions are the same as in the LED shown in FIG. 1 and the same numerals and signs are attached for the same constitutions, for which detailed description is omitted.

The invention is not limited to the above embodiments of the invention. Various modified embodiments in the range easily conceived by those skilled in the art without departing from claims are also included in the invention.

The invention claimed is:

1. A light-emitting apparatus, comprising:
a lead frame having a surface which comprises Ag, Cu, or Al;
a light-emitting element fixed to the surface of the lead flame; and
a silicone-sealed portion which seals the light-emitting element with a silicone resin, the silicone resin having an average spin-spin relaxation time of $^1$H nuclei measured by a pulse NMR method that is equal to or smaller than 100 microseconds at 25° C. at a resonance frequency of 25 MHz.

2. The light-emitting apparatus according to claim 1, wherein the surface of the lead frame is silver-plated.

3. The light-emitting apparatus according to claim 1, wherein the silicone resin comprises a thermosetting silicone resin comprising a phenyl group and a norbornene backbone.

4. The light-emitting apparatus according to claim 2, wherein the silicone resin comprises a thermosetting silicone resin comprising a phenyl group and a norbornene backbone.

5. The light-emitting apparatus according to claim 1, wherein the average spin-spin relaxation time is 50 microseconds or less.

6. The light-emitting apparatus according to claim 1, wherein the light-emitting element comprises a Group III nitride-based compound semiconductor.

7. The light-emitting apparatus according to claim 6, wherein the Group III nitride-based compound semiconductor is represented by a general formula $Al_xGa_yIn_{1-x-y}N$ ($0 \leq X \leq 1$, $0 \leq Y \leq 1$, $0 \leq X+Y \leq 1$).

8. The light-emitting apparatus according to claim 7, wherein at least a part of the Group III nitride-based compound semiconductor is replaced by boron (B) or thallium (Tl), and at least a part of nitrogen (N) is replaced by phosphorus (P), arsenic (As), antimony (Sb), or bismuth (Bi).

9. The light-emitting apparatus according to claim 1, wherein electrodes of the light-emitting element are wire-bonded to the lead frame.

10. The light-emitting apparatus according to claim 1, wherein the silicone resin comprises a carbon-carbon double bond structure.

11. The light-emitting apparatus according to claim 1, wherein the silicone resin comprises a norbornene structure.

12. The light-emitting apparatus according to claim 11, wherein the norbornene structure comprises a Si-norbornene structure.

13. The light-emitting apparatus according to claim 12, wherein the Si-norbornene structure crosslinks between Si—H.

14. The light-emitting apparatus according to claim 1, wherein the silicone resin has a refractive index of 1.5 or more.

15. A light-emitting apparatus, comprising:
a lead frame;
a light-emitting element disposed on a surface of the lead flame; and
a silicone resin which seals the light-emitting element, the silicone resin having an average spin-spin relaxation time of $^1$H nuclei measured by a pulse NMR method that is equal to or smaller than 100 microseconds at 25° C. at a resonance frequency of 25 MHz.

16. The light-emitting apparatus according to claim 15, wherein the silicone resin comprises a thermosetting silicone resin comprising a phenyl group and a norbornene backbone.

17. The light-emitting apparatus according to claim 16, wherein the norbornene structure comprises a Si-norbornene structure.

18. The light-emitting apparatus according to claim 17, wherein the Si-norbornene structure crosslinks between Si—H.

19. The light-emitting apparatus according to claim 15, wherein the silicone resin comprises a carbon-carbon double bond.

20. A manufacturing method of a light emitting apparatus which comprises a lead frame having a surface which comprises Ag, Cu, or Al and a light-emitting element fixed to the surface of the lead flame, said method comprising:

preparing a silicone resin;

measuring an average spin-spin relaxation time of $^1$H nuclei in the silicone resin by pulse NMR method;

evaluating the silicone resin whether an average spin-spin relaxation time of 1H nuclei is equal to or smaller than 100 microseconds at 25° C. at a resonance frequency of 25 MHz; and selecting the silicone resin based on said evaluating the silicone resin; and sealing the light emitting element by the selected silicone resin.

* * * * *